(12) United States Patent
Hosokawa

(10) Patent No.: US 6,452,832 B2
(45) Date of Patent: Sep. 17, 2002

(54) DRAM CIRCUIT AND METHOD OF CONTROLLING THE SAME

(75) Inventor: Kohji Hosokawa, Ohtsu (JP)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/681,200

(22) Filed: Feb. 19, 2001

(30) Foreign Application Priority Data

Mar. 3, 2000 (JP) ........................................ 2000-059279

(51) Int. Cl.[7] .............................................. G11C 11/24
(52) U.S. Cl. ..................... 365/149; 365/205; 365/189.06
(58) Field of Search ................................ 365/149, 205, 365/189.06

(56) References Cited

U.S. PATENT DOCUMENTS 5,566,128 A * 10/1996 Magome ................. 365/230.06
6,122,217 A * 9/2000 Keeth et al. ............ 365/230.03
6,212,110 B1 * 4/2001 Sakamoto et al. .......... 365/190

* cited by examiner

Primary Examiner—Hoai Ho
Assistant Examiner—Connie C. Yoha
(74) Attorney, Agent, or Firm—Robert A. Walsh

(57) ABSTRACT

To provide a DRAM circuit capable of achieving a high speed write operation even when the write operation is accompanied with a write masking operation, and a method of controlling the same. A DRAM circuit of the present invention has a novel column switch for connecting a bit line pair and a data line pair via a sense amplifier. The novel column switch has a function to separate a bit line pair corresponding to a selected data line pair during the write mask operation. As a result, even if the column switch is made to be ON before the it line pair is sufficiently amplified by the sense amplifier, there is no fear that data on the bit line pair is destroyed due to a malfunction of the sense amplifier, thus making it possible to achieve a high speed write operation without depending on whether the write masking operation in the DRAM circuit is performed or not.

3 Claims, 3 Drawing Sheets

DRAM CIRCUIT AND METHOD OF CONTROLLING THE SAME

BACKGROUND OF THE INVENTION

The present invention relates to a Dynamic Random Access Memory (hereinafter referred to as DRAM) circuit and a method of controlling the same, more particularly to achieving a high speed write operation accompanied with a write masking operation for the DRAM circuit. Note that the write masking operation means that a part of data is not written during a write operation, that is, the part of the data is masked.

FIG. 1 is a circuit diagram showing a conventional DRAM circuit. The circuit shown in FIG. 1 comprises a memory cell array 1, a group of bit line pairs 2, a group of sense amplifiers (S/A) 3, a group of column switches 4, a group of data line pairs 5 and column select lines 6. Each sense amplifier 3 is connected to corresponding one of the bit line pairs (BL,/BL) 2 and to corresponding one of the column switches 4 composed of a pair of N-channel FETs (hereinafter referred to as NFETs). Each column switch 4 is connected to corresponding one of data line pairs (DL,/DL) 5. The four column switches 4 are connected to one column select line 6. The four column switches 4 are controlled so as to be turned ON/OFF depending on a level (High, Low) of a signal on the column select line 6. The turning ON of the column switch 4 allows the bit line pair 2 to be electrically connected to the corresponding data line pair 5 via the sense amplifier 3.

In the write operation of the DRAM circuit shown in FIG. 1, the bit line pair 2 is first amplified by the sense amplifier 3 sufficiently. Thereafter, the previously decided four column switches 4 are turned ON by a high level signal on the column select line 6. As a result, the four bit line pairs 2 are connected to the corresponding data line pairs 5. At the same time, write data (potential) of each data line pair 5 is inputted to corresponding one of the sense amplifiers 3, and thus data (potential) on the bit line pair 2 is made to be inverted.

The write masking operation is performed simultaneously with the write operation. When the write masking operation is performed, a selected data line 2 is clamped to be high in level similarly to a read operation. Thereafter, the previously decided four column switches 4 are turned ON by a high level signal on the column select line 6, and thus the operation is finished.

In a state where the four column switches 4 are turned ON, if the bit line pair 2 is not in a sufficiently amplified condition by the sense amplifier 3, the sense amplifier 3 malfunctions due to a load of the data line pair, that is, a high potential, so that data on the bit line pair 2 may be destroyed. To prevent the data from being destroyed by the malfunction of the sense amplifier 3, the column switch 4 must be turned ON after the bit line pair 2 has been sufficiently amplified by the sense amplifier 3. However, as a result of this, there is a problem that the write operation accompanied with the write masking operation takes more time than a write operation accompanied with no write masking operation. In other words, there is a problem that it is impossible to achieve a high speed write operation in the DRAM circuit. Note that in the case of the write operation accompanied with no write masking operation, generally, it does not matter even if the column switch 5 is turned ON before the bit line pair 2 is sufficiently amplified by the sense amplifier 3. The reason is that because the write operation rewrites data of the bit line pair 2, no problem occurs even if the data before rewriting is destroyed.

BRIEF SUMMARY OF THE INVENTION

The object of the present invention is to solve the foregoing problems. Specifically, the object of the present invention is to provide a DRAM circuit of achieving a high speed write operation even when the write operation is accompanied with a write masking operation and a method of controlling the DRAM circuit.

According to the present invention, a DRAM circuit including novel column switches is provided. The novel column switches are controlled by a signal on a data line pair. In other words, the column switches are controlled in accordance with a potential state of the signal on the data line pair. Furthermore, the novel column switches have a function to separate a selected data line pair from a bit line pair corresponding thereto during a write masking operation.

BRIEF DESCRIPTION OF THE SEVERAL VIEWS OF THE DRAWINGS

For a more complete understanding of the present invention and the advantages thereof, reference is now made to the following description taken in conjunction with the accompanying drawings, in which.

DETAILED DESCRIPTION OF THE INVENTION

An embodiment of the present invention will be described with reference to the accompanying drawings in detail.

Figure 1:
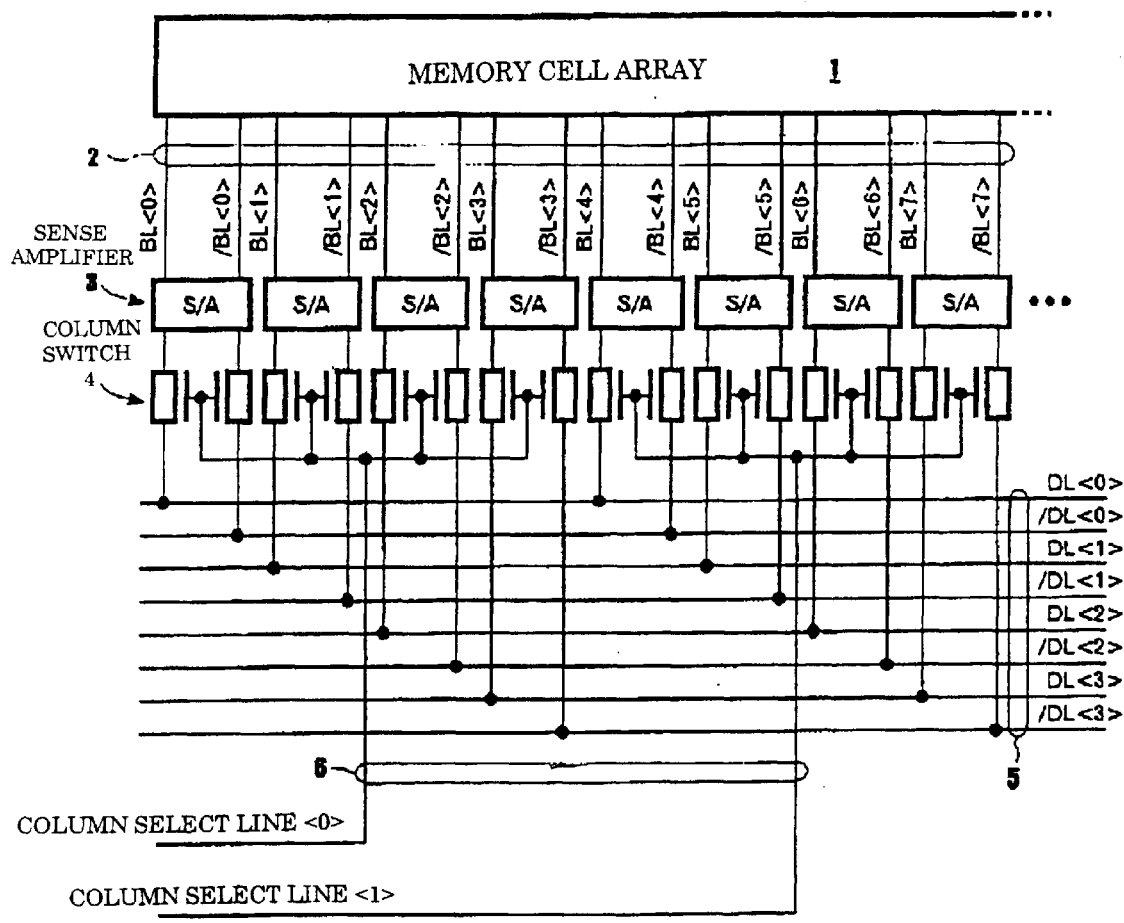
FIG. 1 is a circuit diagram showing a constitution example of a conventional DRAM circuit.
Figure 2:
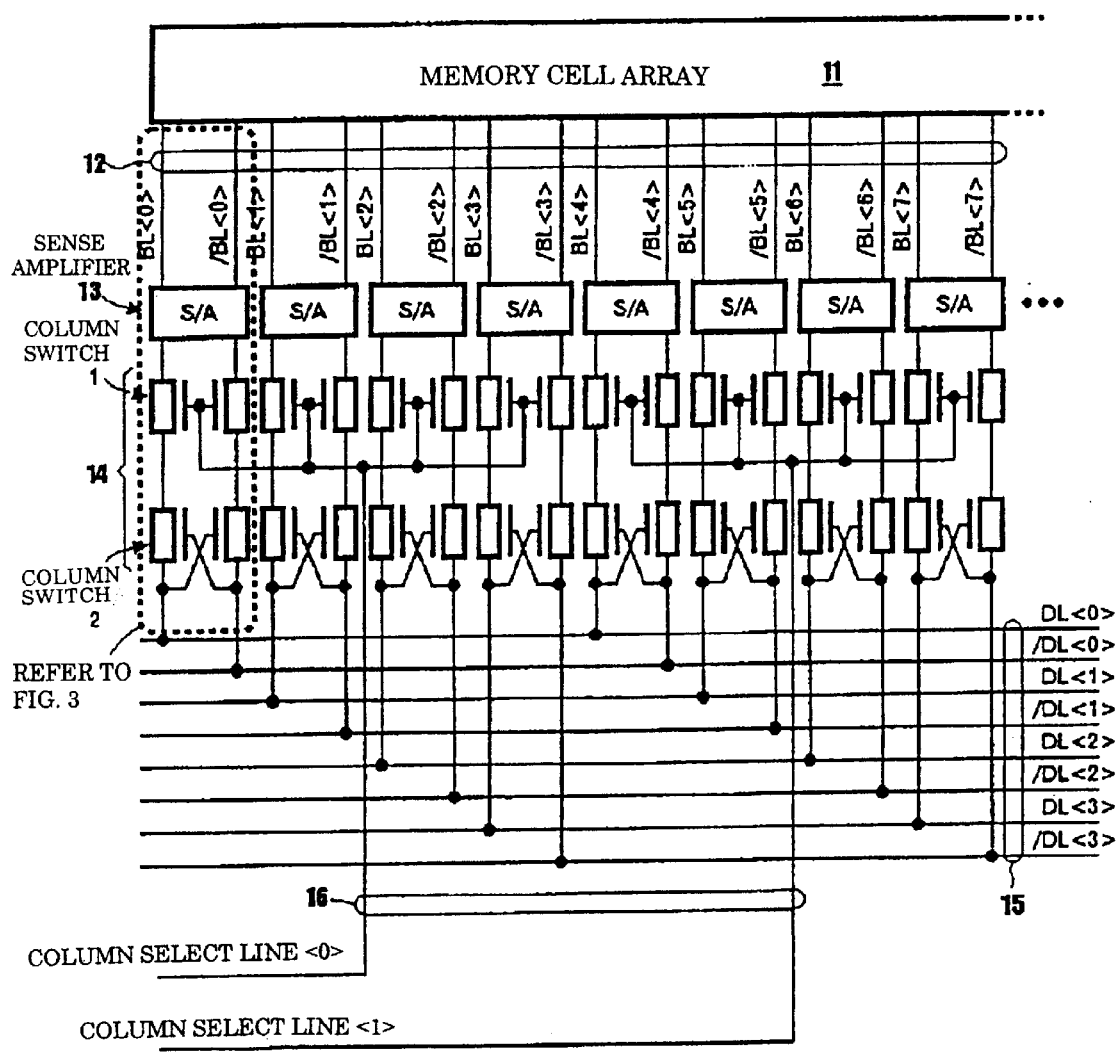
FIG. 2 is a circuit diagram showing an embodiment of a DRAM circuit of the present invention.

FIG. 2 is a circuit diagram showing an embodiment of a DRAM circuit according to the present invention. The DRAM circuit shown in FIG. 2 includes a memory cell array 11, a group of bit line pairs 12, a group of sense amplifiers 13, a group of column switches 14, a group of data line pairs 15 and column select lines 16. The circuit of FIG. 2 is identical to the conventional circuit of FIG. 1 except for the column switches 14. To be more specific, the column switches 14 in FIG. 2 have a novel constitution. Constitutions of the sense amplifiers and the like are basically identical to those of FIG. 1.

Figure 3:
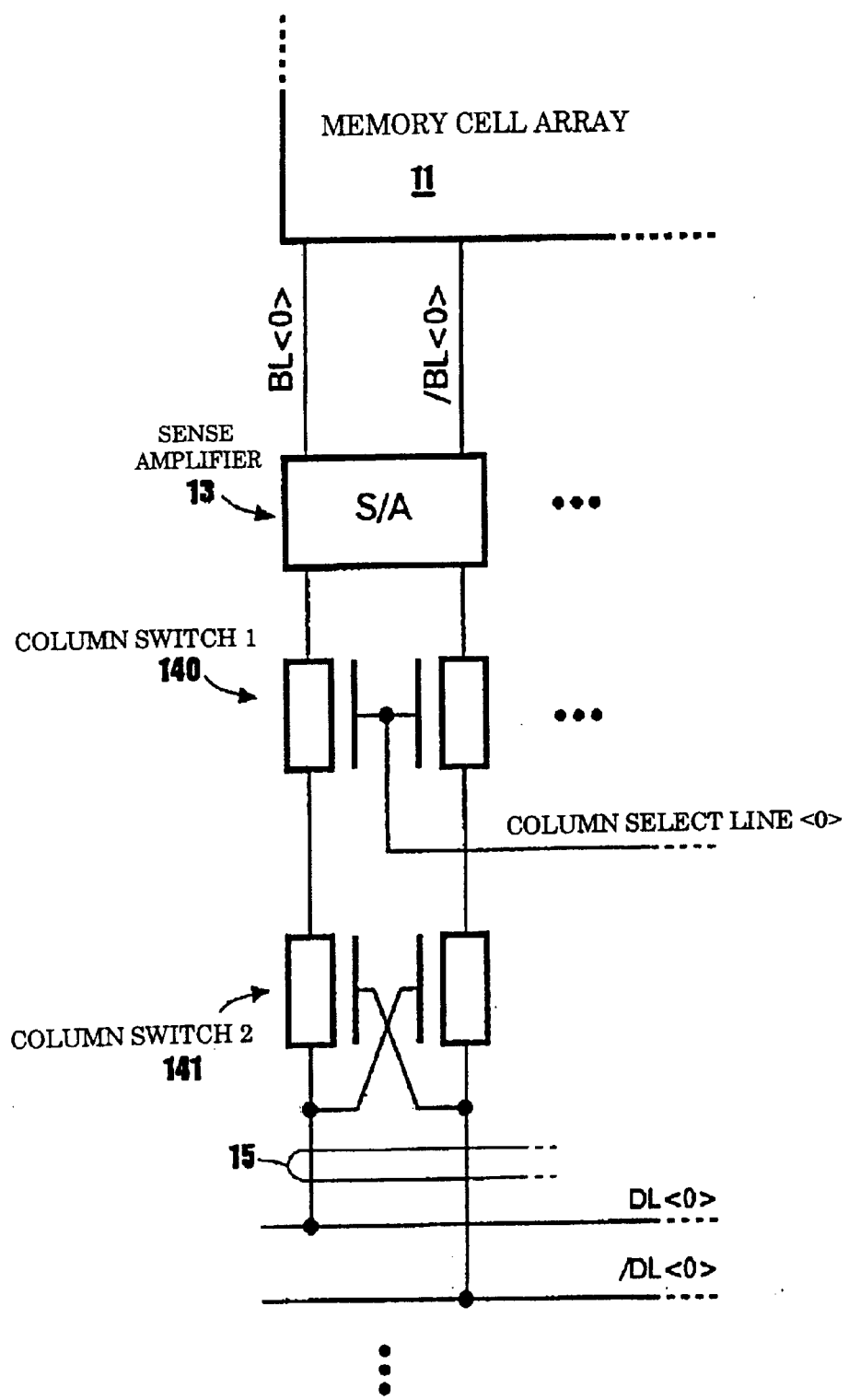
FIG. 3 is a partially enlarged view of a column switch in FIG. 2 and the neighborhood thereof.

FIG. 3 is an enlarged view of the column switch 14 in FIG. 2 and the neighborhood of it. In FIG. 3, the column switch 14 includes a first switch 140 composed of a pair of NFETs and a second switch 141 composed of a pair of NFETs. The first switch 140 is connected to the sense amplifier 13 and the second switch 141. The gates of the two NFETs constituting the first switch 140 are connected together to the column select line 16. The second switch 141 is connected to the data line pair 15. One gate of the two NFETs constituting the second switch 141 is connected to one data line DL of the data line pair 15 via the current path of the opposite NFET and the other is connected to the other data line /DL thereof via the current path of another NFET. That is, so called a cross multiplication structure is formed.

An operation of the circuit shown in FIGS. 2 and 3 will be described.

Read Operation (a) The sense amplifier 13 amplifies the bit line pair 12 sufficiently.

(b) The data line pair 15 is clamped to be high in level (a high potential). With clamping the data line pair 15 to be high in level, the two NFETs of the second switch 141 are turned ON (closed), and self-hold the turned ON state thereof. Clamping the data line pair 15 to be high in level is performed by a driving circuit (not shown) connected to the data line pair 15.

(c) The column select line 16 is made to be high in level, and thus the two NFETs of the first switch 140 are turned ON, resulting in closing the first switch 140.

(d) Since the two NFETs of the second switch 141 have been already turned ON (closed) together at this time, the data line pair 15 corresponding to the sense amplifier 13 is made to be conductive.

(e) Data on the bit line pair 12 is outputted onto the data line pair 15 via the sense amplifier 13.

Write Operation (a) One data line DL of the data line pair 15 having write data is made to be high in level (high potential), and the other data line /DL is made to be low in level (low potential). Note that the potential control for the data line pair 15 is performed by a driving circuit (not shown) connected to the data line pair 15.

(b) With the high potential of the data line DL, the NFET of the second switch 141 on the side of the data line /DL which is low in level, is turned ON.

(c) The column select line 16 is made to be high in level, and thus the two NFETs of the first switch 140 is turned ON, resulting in closing the first switch 140.

(d) Low level data on the data line /DL is written to the sense amplifier 13 via the NFETs of the closed column switches 140 and 141 on the side of the data line /DL which is low in level.

Write Masking Operation

The write masking operation described below is performed simultaneously with the write operation.

(a) Both the data lines DL and /DL of the data line pair 15 selected for the write masking are fixed to be low in level (first potential). Note that the potential control for the data line pair 15 is performed by a driving circuit (not shown) connected to the data line pair 15.

(b) The low potential of the selected data line pair 15 allows both the two NFETs of the second switch 141 to turn OFF, and the two NFETs self-hold the turning OFF state. Accordingly, even if the two NFETs of the first switch 140 has been in turning ON state (closing state), the data line pair 15 and the sense amplifier 13 are electrically disconnected, that is, isolated from each other.

According to the DRAM circuit of the present invention described above, when the write masking is performed during the write operation, the selected column switch 14 is made to be OFF, to be more precise, the second switch 141 is made to be OFF. Thus, the data line pair 15 and the sense amplifier 13 (or the bit line pair 12), which correspond to the switch 14, are isolated (nonconductive) from each other. Accordingly, even if the column switch 14 is made to be OFF before the bit line pair 12 is sufficiently amplified by the sense amplifier 13, there is no fear that data on the bit line pair 12 may be destroyed due to malfunction of the sense amplifier 13. In other words, in the DRAM circuit of the present invention, even if the column switch 14, to be more precise, the first switch 140, is made to be ON (conductive) concurrently with an operation start of the sense amplifier 13 during the write operation, a malfunctioning write masking operation performed simultaneously with the write operation never occurs, that is, data destruction never occurs due to the malfunctioning write masking operation. In other words, in the DRAM circuit of the present invention, the column switch 14, to be more precise, the first switch 140, can be made to be ON (conductive) concurrently with an operation start of the sense amplifier 13. As a result, speeding-up of the write operation can be achieved without depending on whether the write masking operation in the DRAM circuit is performed or not.

Although the NFETs are used as the column switch 14 in the embodiment shown in FIGS. 2 and 3, the column switch 14 is not limited to such constitution. Specifically, with some changes to the column switch 14, it is obvious for a person skilled in the art that, for example, PFETs and other semiconductor switching devices can be used. Furthermore, as a matter of course, the DRAM circuit of the present invention can be fabricated by use of semiconductor processes for GaAs and the like in addition to processes for silicon.

Although the preferred embodiment of the present invention has been described in detail, it should be understood that various changes, substitutions and alternations can be made therein without departing from spirit and scope of the inventions as defined by the appended claims.

What is claimed is:

1. A DRAM circuit comprising: a memory cell; a bit line pair; a sense amplifier connected to said memory cell via said bit line pair; a data line pair; and a column switch for connecting said bit line pair to said data line pair corresponding thereto via said sense amplifier, wherein the column switch previously selected is made to be OFF during a write masking operation, and said bit line pair corresponding to said data line pair connected to said column switch is made to be nonconductive.

2. The DRAM circuit according to claim 1, wherein said column switch is selected by a selection signal on a column select line connected to said column switch, and said selected column switch is made to be OFF by a signal on the data line pair corresponding to said selected column switch.

3. A method of controlling a DRAM circuit which comprises: a memory cell;

a bit line pair; a sense amplifier connected to said memory cell via said bit line pair;

a data line pair; and a first and second column switch for connecting said bit line pair to said data line pair corresponding thereto via said sense amplifier, the method comprising the steps of: selecting a data line pair for a write masking in a write operation;

setting each line of the selected data line pair to a first potential using said first column switch; and allowing said second column switch to be OFF by the first potential of said data line pair.

* * * * *